United States Patent [19]
Quilliam

[11] 4,101,935
[45] Jul. 18, 1978

[54] ELECTRON BEAM READING ARRANGEMENTS

[75] Inventor: Robert Mark Quilliam, Chelmsford, England

[73] Assignee: The Marconi Company Limited, England

[21] Appl. No.: 595,106

[22] Filed: Jul. 11, 1975

[30] Foreign Application Priority Data

Jul. 11, 1974 [GB] United Kingdom ............... 30687/74

[51] Int. Cl.² .......................... H04N 1/00; H04N 1/28
[52] U.S. Cl. ..................................... 358/293; 358/300
[58] Field of Search ....................... 178/6.6 TP, 6.6 A; 358/300, 293

[56] References Cited

U.S. PATENT DOCUMENTS

| | | | |
|---|---|---|---|
| 3,181,125 | 4/1965 | Vadopalas | 178/6.6 TP |
| 3,247,493 | 4/1966 | Wolfe | 178/6.6 TP |
| 3,308,444 | 3/1967 | Ting | 178/6.6 TP |
| 3,389,382 | 6/1968 | Hart | 178/6.6 TP |
| 3,400,382 | 9/1968 | Kurzweil | 178/6.6 TP |

*Primary Examiner*—Thomas B. Habecker

[57] ABSTRACT

An electron beam is used for reading signals in the form of surface modulations on a thermoplastic recording. In order to improve the signal to noise ratio the thermoplastic recording is first charged using a flood beam source of electrons and the surface charge so produced repells scanning reading electrons which are then collected by a detector.

8 Claims, 5 Drawing Figures

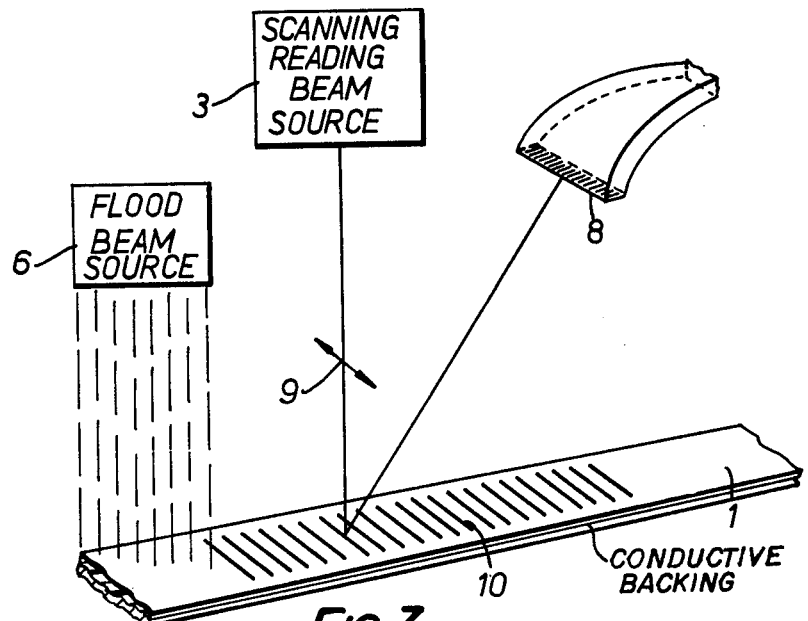
Fig.3.
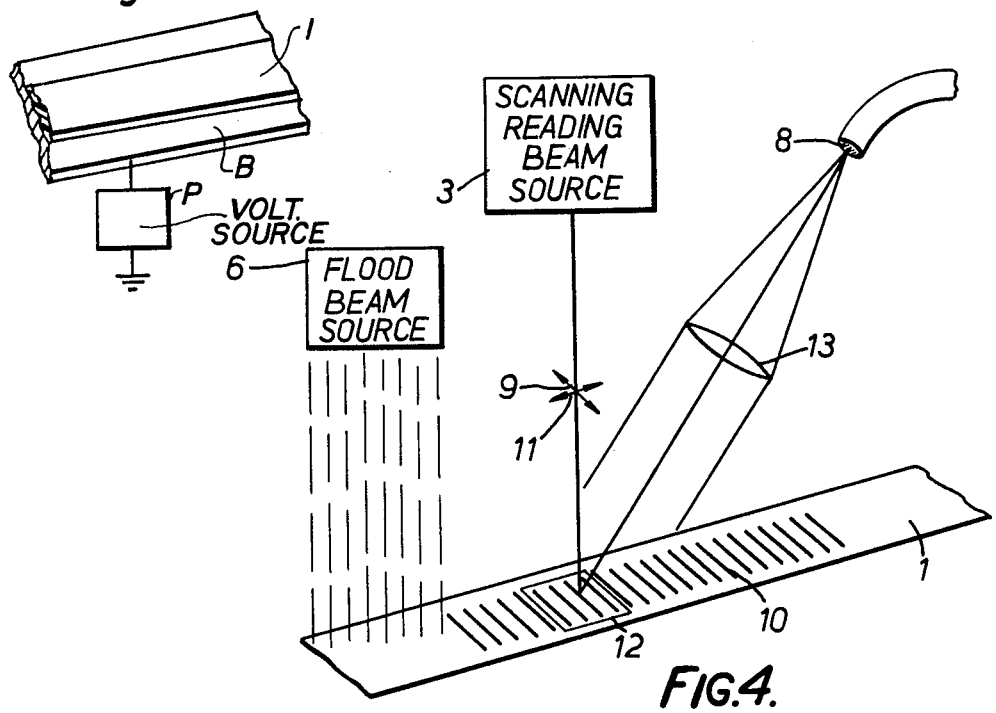
Fig.5
Fig.4.

ELECTRON BEAM READING ARRANGEMENTS

This invention relates to electron beam reading arrangements and more particularly, but not exclusively to electron beam reading arrangements for generating signals corresponding to the surface modulation pattern of a thermoplastic recording.

The technique of recording on thermoplastic recording medium, usually a tape, is now well known. Thermoplastic recording material can be modulated with very high densities of information by exposing the material to a modulated electron beam to deposit a modulated charge pattern on the material which is subsequently "developed" by heating the material to its softening point to provide a surface modulation pattern corresponding to the deposited charge pattern.

In order to read-out the information stored on the material it is usual to scan the surface of the material by reading electron beam and to detect secondary electrons emitted from the surface of the tape. The normal method of reading out the surface modulations of a thermoplastic tape is illustrated in highly schematic manner in FIG. 1 of the accompanying drawing.

Referring to FIG. 1, illustrates a very small portion of a typical surface profile of a modulated thermoplastic tape. In order to read-out the surface modulations of the tape, the tape surface is scanned by a reading electron beam 2 provided by a scanning electron beam source 3. The reading beam 2, upon striking the surface 1, generates secondary electrons 4 which are collected by a secondary electron detector 5.

It has been found that, following current practice as illustrated in FIG. 1, it is difficult to obtain satisfactorily high signal to noise ratio during read-out and the error rate in the retrieved information tends to be higher than is desirable. This difficulty is believed to be due to the Lambertian distribution of the secondary electrons with respect to the surface giving a signal which varies only slightly with surface inclination. The detectors utilised to collect the secondary electrons released by the reading beam are also unbiassed with respect to the beam which tends to give poor collection efficiency resulting in an attenuated signal at the detector.

The present invention seeks to provide an improved method and arrangement for developing signals corresponding to the modulation of a surface and in particular the modulated surface of a thermoplastic recording medium in which the above mentioned difficulties are reduced.

According to one aspect of this invention a method of developing an electrical signal corresponding to variations in the topography of a surface comprises the steps of causing said surface to be charged with electrons, scanning said charged surface with a reading electron beam and collecting electrons of said beam repelled by the surface charge of said surface.

According to another aspect of this invention, an arrangement for developing electrical signals corresponding to variations in the topgraphy of a surface comprises means for causing said surface to be charged with electrons, means for scanning said charged surface with an electron beam and means for collecting electrons from said beam repelled by said charged surface.

The invention is principally concerned with developing electrical signals corresponding to the surface modulations of a thermoplastic recording medium. However, it may also be applicable to scanning electron microscope arrangements provided to carry out topographical investigations of a surface.

A preferred method of charging said surface with electrons involves the use of flood beam means provided to flood said surface with electrons prior to scanning by said scanning beam. In some cases, however, for example in the case of a thermoplastic recording tape, it is possible to connect a suitable voltage source to the medium of the surface to provide a suitable bias voltage.

It is also possible, for example, to charge the surface utilising the reading beam itself by scanning the reading beam many times over the surface before a reading scan is made. This is not considered to be a satisfactorily efficient method however.

Where said thermoplastic medium is a thermoplastic recording tape having as normally is the case, a conductive backing (of aluminium for example) and flood beam means is provided to charge said surface, preferably means is provided for applying a potential to said backing so as to reduce the potential drop across the thermoplastic layer. Normally said means for applying potential to said backing is such that said potential is equal to or slightly less than the electron gun cathode potential of said flood beam means. It has also been found advantageous to extend the backing of the tape to either side of the thermoplastic material in order to produce a more uniform field pattern in the vicinity of the thermoplastic material.

By suitably choosing the surface charge the electrons of the reading beam will turn round within a very small distance of the surface and variations in surface slope will cause electrons to be reflected at well defined angles. The signal which can be collected by an appropriately positioned detector tends to be of sharply pulsed form of good modulation index and with good collection efficiency.

Normally the relationship between the surface charge and the voltage of the reading beam is such that substantially no electrons from the reading beam enter the medium itself. In the case of a thermoplastic reading material, for example, this feature reduces the possibility of damage to the plastic material during reading and in a storage system where it is required repeatedly to interrogate the information stored in a thermoplastic medium the danger of charge deposited by the reading beam on one occasion interfering with subsequent reading scans is reduced.

Normally, where the thermoplastic medium is a thermoplastic recording tape as with prior arrangements, the electron reading beam is rastered transversely across the thermoplastic layer of the tape. Utilising a conventional detector it has been found that as the electron beam is rastered across the tape surface the slope corresponding to maximum signal detected changes progressively due to the geometric arrangement of the tape, reading beam and detector. In order to reduce this difficulty a detector having a rectangular active face which is elongated in a direction transverse to the longitudinal axis of the tape may be used. In this case one dimensional scans parallel to the longer axis of the detector (i.e. transverse to the longitudinal axis of the tape) will cause the detector to sense a more uniform surface slope.

In order to permit relatively uniform read-out over a two dimensional area of the surface by utilising two dimensional scans, an electron lens may be provided to collect electrons repelled by said surface, and focus these onto an electron detector positioned in the back focal plane thereof.

FIG. 3 is a view illustrating one form of the invention;

FIG. 4 is a view illustrating another form of the invention; and

FIG. 5 is a view illustrating another form of the invention.

Figure 2:
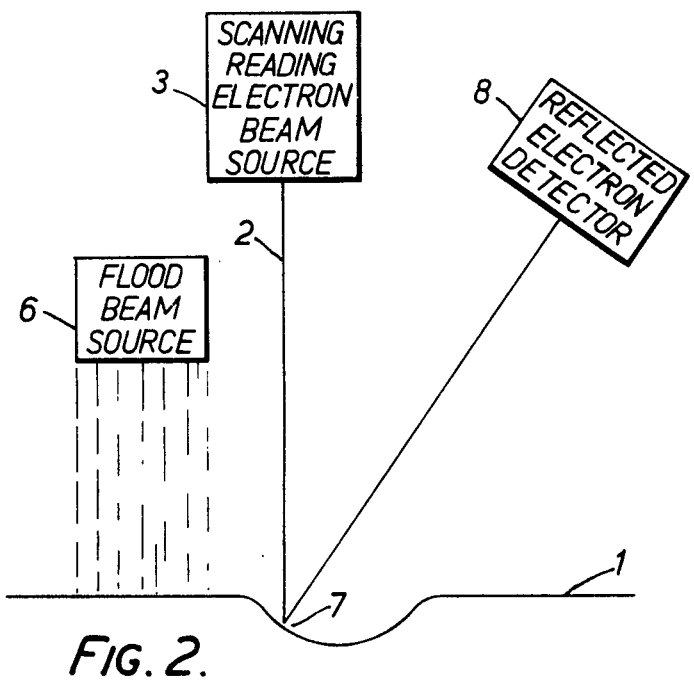
FIG. 2 is a view similar to FIG. 1 but showing the concepts of the present invention.

One example of an arrangement for reading out the surface modulations of a thermoplastic tape in accordance with the present invention is illustrated in highly schematic manner in FIG. 2 of the drawing accompanying the provisional specification.

Two modifications are schematically illustrated in FIGS. 3 and 4 of the accompanying drawings.

Like reference are used for like parts are used in all Figures.

Figure 1:
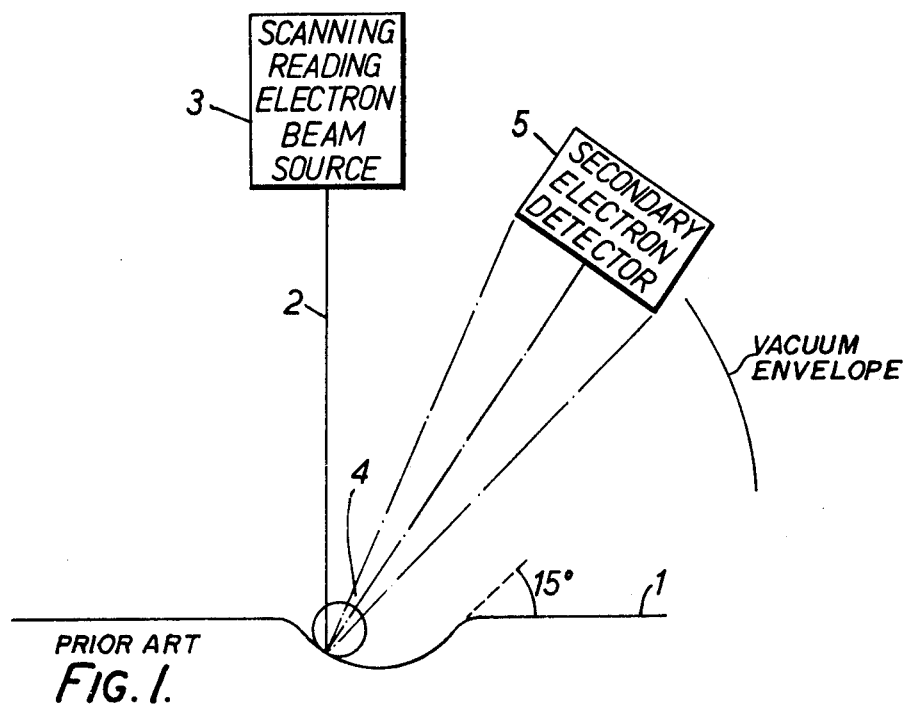
FIG. 1 is a diagrammatic view illustrating the prior art.

Referring to FIG. 2, the surface profile of the thermoplastic tape is again represented at 1, and again the reading beam 2 is generated by a scanning electron beam source 3. In accordance with the present invention a flood beam source 6 is provided which floods the surface 1 with electrons prior to scanning by the readout beam 2. The surface charge provided on the surface 1 is related to the voltage of the scanning beam 2 such that the electrons in the scanning beam 2 are turned away at 7 a short distance from the surface 1 and reflected to a suitably positioned reflected electron detector 8. The positioning of reflected electron detector 8 and the process of providing a useful output signal is similar to those involved in the case of the secondary electron detector 5 of FIG. 1. However, the signal which is collected by the detector 8 will be found to be a sharply pulsed signal of good modulation index and with good collection efficiency.

It should be noted that whilst normally the relationship between the surface charge of the surface 1 and the voltage of the reading beam 2 is such that substantially no electrons from the reading beam 2 enter into the thermoplastic medium, even where this ideal relationship does not exist and the surface charge is not sufficient to reflect substantially all of the electrons in the reading beam, as would be the case if the reading beam itself were used to charge the surface by scanning the beam many times over the surface before a reading scan was made, an improvement in signal to noise ratio and in modulation index compared to a conventional secondary electron technique may still be obtained, since any electrons entering the thermoplastic medium do so with greatly reduced energies. The electrons entering the thermoplastic medium in such a case are reflected by molecular collision or generate secondary electrons which are subsequently repelled from the surface 1 by the surface charge to give what approximates to specular reflection.

It has been found advantageous to provide means P for applying a potential to the backing B of the thermoplastic tape 1 (assuming that the tape is of the conventional kind which has a conductive backing of, for example, aluminium) in order to reduce the potential drop across the thermoplastic layer. The potential applied is equal to or slightly less than the electron gun cathode potential of the flood beam source 6. The tape surface is brought into equilibrium with the reading electron beam potential by flooding as previously described. However by making the potential drop across the thermoplastic material arbitrarily small complications caused by conductivity or breakdown of the thermoplastic material may be avoided.

It has also been found advantageous where a potential is applied to the backing layer of the tape to extend this layer on either side of the tape as shown in FIG. 5 in order to produce a uniform field pattern in the vicinity of the tape. This still maintains the reflection equipotential contiguous with the tape surface, but reducing the field variations surrounding the thermoplastic material largely negates what would otherwise be a potential source of distortion of the reflection pattern.

With the arrangement described above with reference to FIG. 2, the detector 5 is conventional. As the electron reading beam is rastered transversly across the thermoplastic layer of the tape, the slope corresponding to maximum signal detected by the detector 8 changes progressively due to the geometric arrangement of the tape 1, the scanning beam of the reading beam source 3 and the detector 8. In the modification schematically illustrated in FIG. 3, the reflected electron detector 8 is provided to have an active face which is a thin rectangle, elongated in the direction of scanning (i.e. in a direction transverse to the longitudinal axis of the tape). With such an arrangement one dimensional scans in a direction, represented by the arrow 9, transverse to the longitudinal axis of the tape 1 will cause the detector 8 to sense a more constant surface slope. This renders it possible to scan along lines of information written parallel, as represented by the lines 10, to the longitudinal axis of the tape 1.

The modification schematically illustrated in FIG. 4 is provided to permit two directional scanning as represented by the arrows 9 and 11, in order to obtain relatively uniform readout over an area as represented by the outline 12. In this case an electron lens 13 is provided to collect electrons returning from the tape 1 and focus these onto the detector 8 positioned in the back focal plane of the electron lens 13. In this case, the active face of the detector 8 may be conventional.

I claim:

1. A method of developing an electrical signal corresponding to surface modulations in a dielectric surface comprising the steps of charging said dielectric surface with electrons, scanning said charged dielectric surface with a reading electron beam and collecting predominantly electrons of said beam reflected by the surface charge of said dielectric surface at said modulations.

2. In the method of developing an electrical signal corresponding to surface modulations in a recording dielectric surface which comprises the steps of scanning said dielectric surface with a reading electron beam, and using a detector such that electrons arising predominantly at said dielectric surface modulations are detected thereby, the improvement which comprises:

charging said dielectric surface with electrons prior to said scanning whereby the electrons predominantly detected by said detector are reflected electrons of said scanning beam reflected at said dielectric surface modulations.

3. Apparatus for developing an electrical signal corresponding to surface modulations in a recording dielectric surface wherein the signal exhibits a high signal to noise ratio, comprising in combination:

electron beam source means for scanning said dielectric surface with a reading electron beam;

electron detector means positioned to detect predominantly those electrons of said reading electron beam reflected from said dielectric surface modulations for generating said electrical signal; and means for charging said dielectric surface with electrons prior to impingement of said reading electron beam thereon, the means for charging imparting a charge sufficient to cause said reading electron beam to be at least substantially entirely reflected by such charge.

4. An arrangement as claimed in claim 3 and wherein said surface is the surface of a thermoplastic recording medium.

5. An arrangement as claimed in claim 3 and wherein said means for charging comprises flood beams means provided to flood said surface with electrons prior to scanning by said reading electron beam.

6. An arrangement as claimed in claim 3 wherein said means for charging charges said surface sufficiently such that substantially no electrons from the reading electron beam enter the surface itself.

7. An arrangement as claimed in claim 3 and wherein said electron detector means has a rectangular active face which is elongated in a direction transverse to the longitudinal axis of the medium.

8. An arrangement as claimed in claim 3 including an electron lens provided to collect electrons repelled by said surface and focus these onto said electron detector means, said electron detector means being located in the back focal plane of said electron lens.

* * * * *